(12) United States Patent
Nguyen et al.

(10) Patent No.: US 10,017,857 B2
(45) Date of Patent: Jul. 10, 2018

(54) METHOD AND APPARATUS FOR CONTROLLING PLASMA NEAR THE EDGE OF A SUBSTRATE

(71) Applicant: APPLIED MATERIALS, INC., Santa Clara, CA (US)

(72) Inventors: Andrew Nguyen, San Jose, CA (US); Yang Yang, Sunnyvale, CA (US); Kartik Ramaswamy, San Jose, CA (US); Steven Lane, Porterville, CA (US); Lawrence Wong, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/144,736

(22) Filed: May 2, 2016

(65) Prior Publication Data
US 2016/0322242 A1 Nov. 3, 2016

Related U.S. Application Data

(60) Provisional application No. 62/156,232, filed on May 2, 2015.

(51) Int. Cl.
*C23C 16/00* (2006.01)
*H01L 21/306* (2006.01)
(Continued)

(52) U.S. Cl.
CPC .......... *C23C 16/505* (2013.01); *H01J 37/321* (2013.01); *H01J 37/3211* (2013.01);
(Continued)

(58) Field of Classification Search
CPC ............. H01J 37/321; H01J 37/3211; H01J 37/32119; H01J 37/32128;
(Continued)

(56) References Cited

U.S. PATENT DOCUMENTS 5,571,366 A * 11/1996 Ishii .................. H01J 37/32082
118/723 I
5,851,600 A * 12/1998 Horiike ............. H01J 37/32431
118/719

(Continued)

OTHER PUBLICATIONS

U.S. Appl. No. 62/277,299, filed Nov. 11, 2015, Luere et al.
U.S. Appl. No. 62/286,028, filed Jan. 22, 2016, Rogers.
U.S. Appl. No. 62/301,316, filed Feb. 29, 2016, Rogers.

*Primary Examiner* — Luz L Alejandro Mulero
(74) *Attorney, Agent, or Firm* — Moser Taboada; Alan Taboada

(57) ABSTRACT

Methods and apparatus for processing a substrate are provided herein. In some embodiments, an apparatus for processing a substrate includes a process chamber having an internal processing volume disposed beneath a dielectric lid of the process chamber; a substrate support disposed in the process chamber and having a support surface to support a substrate; an inductive coil disposed above the dielectric lid to inductively couple RF energy into the internal processing volume to form a plasma above the substrate support; and a first inductive applicator ring coupled to a lift mechanism to position the first inductive applicator ring within the internal processing volume.

19 Claims, 4 Drawing Sheets

(51) Int. Cl.
*C23C 16/505* (2006.01)
*H01J 37/32* (2006.01)
*H01L 21/687* (2006.01)
*H01L 21/3065* (2006.01)
*H01L 21/311* (2006.01)
*H01L 21/3213* (2006.01)

(52) U.S. Cl.
CPC .. *H01J 37/32165* (2013.01); *H01J 37/32715* (2013.01); *H01L 21/68742* (2013.01); *H01L 21/68785* (2013.01); *H01L 21/3065* (2013.01); *H01L 21/31116* (2013.01); *H01L 21/31138* (2013.01); *H01L 21/32136* (2013.01)

(58) Field of Classification Search
CPC ........... H01J 37/32137; H01J 37/32146; H01J 37/32155; H01J 37/32165; H01J 37/32174; H01J 37/32183
USPC ...... 118/723 I, 723 IR, 723 AN; 156/345.48, 156/345.49; 315/111.51
See application file for complete search history.

(56) References Cited

U.S. PATENT DOCUMENTS

| | | | |
|---|---|---|---|
| 6,039,836 A | 3/2000 | Dhindsa et al. | |
| 6,232,236 B1 | 5/2001 | Shan et al. | |
| 7,655,110 B2* | 2/2010 | Yamazawa | H01J 37/32082 156/345.24 |
| 8,211,324 B2 | 7/2012 | Dhindsa et al. | |
| 8,734,664 B2 | 5/2014 | Yang et al. | |
| 8,988,848 B2 | 3/2015 | Todorow et al. | |
| 2002/0189763 A1* | 12/2002 | Kwon | H01J 37/32174 156/345.48 |
| 2007/0056515 A1* | 3/2007 | Chevalier | H05H 1/46 118/723 I |
| 2013/0107415 A1 | 5/2013 | Banna et al. | |
| 2013/0154175 A1 | 6/2013 | Todorow et al. | |
| 2013/0288483 A1 | 10/2013 | Sadjadi et al. | |
| 2014/0034239 A1 | 2/2014 | Yang et al. | |
| 2014/0069584 A1 | 3/2014 | Yang et al. | |
| 2014/0209244 A1* | 7/2014 | Banna | H01J 37/32651 156/345.49 |
| 2016/0211165 A1 | 7/2016 | McChesney et al. | |
| 2016/0211166 A1 | 7/2016 | Yan et al. | |

* cited by examiner

METHOD AND APPARATUS FOR CONTROLLING PLASMA NEAR THE EDGE OF A SUBSTRATE

CROSS-REFERENCE TO RELATED APPLICATIONS

This application claims benefit of U.S. provisional patent application Ser. No. 62/156,232, filed May 2, 2015, which is herein incorporated by reference.

FIELD

Embodiments of the disclosure generally relate to method and apparatus for processing a substrate.

BACKGROUND

In the current semiconductor manufacturing, feature sizes continue to shrink and transistor structures are becoming increasingly complicated and challenging with the development of FinFET technology. During substrate processing, improved process uniformity control allows fine, localized process tuning as well as global process tuning across the entire substrate. Moreover, the inventors believe that improved capability to control the process near the substrate edge, where the electromagnetic field and plasma density and chemistry change violently due to the existence of multiple material interfaces and geometric shapes/edges, is desirable, particularly because the transistor density across the substrate increases proportionally to the square of the substrate radius. Thus, the inventors believe that plasma control methods that focus on the proximity of the edge region would be advantageous.

Therefore, the inventors have provided an improved method and apparatus for processing of a substrate.

SUMMARY

Methods and apparatus for processing a substrate are provided herein. In some embodiments, an apparatus for processing a substrate includes a process chamber having an internal processing volume disposed beneath a dielectric lid of the process chamber; a substrate support disposed in the process chamber and having a support surface to support a substrate; an inductive coil disposed above the dielectric lid to inductively couple RF energy into the internal processing volume to form a plasma above the substrate support; and a first inductive applicator ring coupled to a lift mechanism to position the first inductive applicator ring within the internal processing volume.

In some embodiments, an apparatus for processing a substrate includes a process chamber having an internal processing volume disposed beneath a dielectric lid of the process chamber; a substrate support disposed in the process chamber and having a support surface to support a substrate; an inductive coil disposed above the dielectric lid to inductively couple RF energy into the internal processing volume to form a plasma above the substrate support; a first inductive exciter coil disposed above the dielectric lid concentrically around the inductive coil; and an inductive applicator ring coupled to a lift mechanism to position the inductive applicator ring within the internal processing volume, wherein the inductive applicator ring is configured to couple RF energy from the first inductive exciter coil to the plasma.

In some embodiments, a method of processing a substrate includes forming a plasma in an internal processing volume of a process chamber above a substrate disposed on a substrate support; providing RF power to an inductive exciter coil disposed in the substrate support; and coupling the RF power to the plasma to tune the plasma proximate an edge of the substrate using an inductive applicator coil disposed about the substrate.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
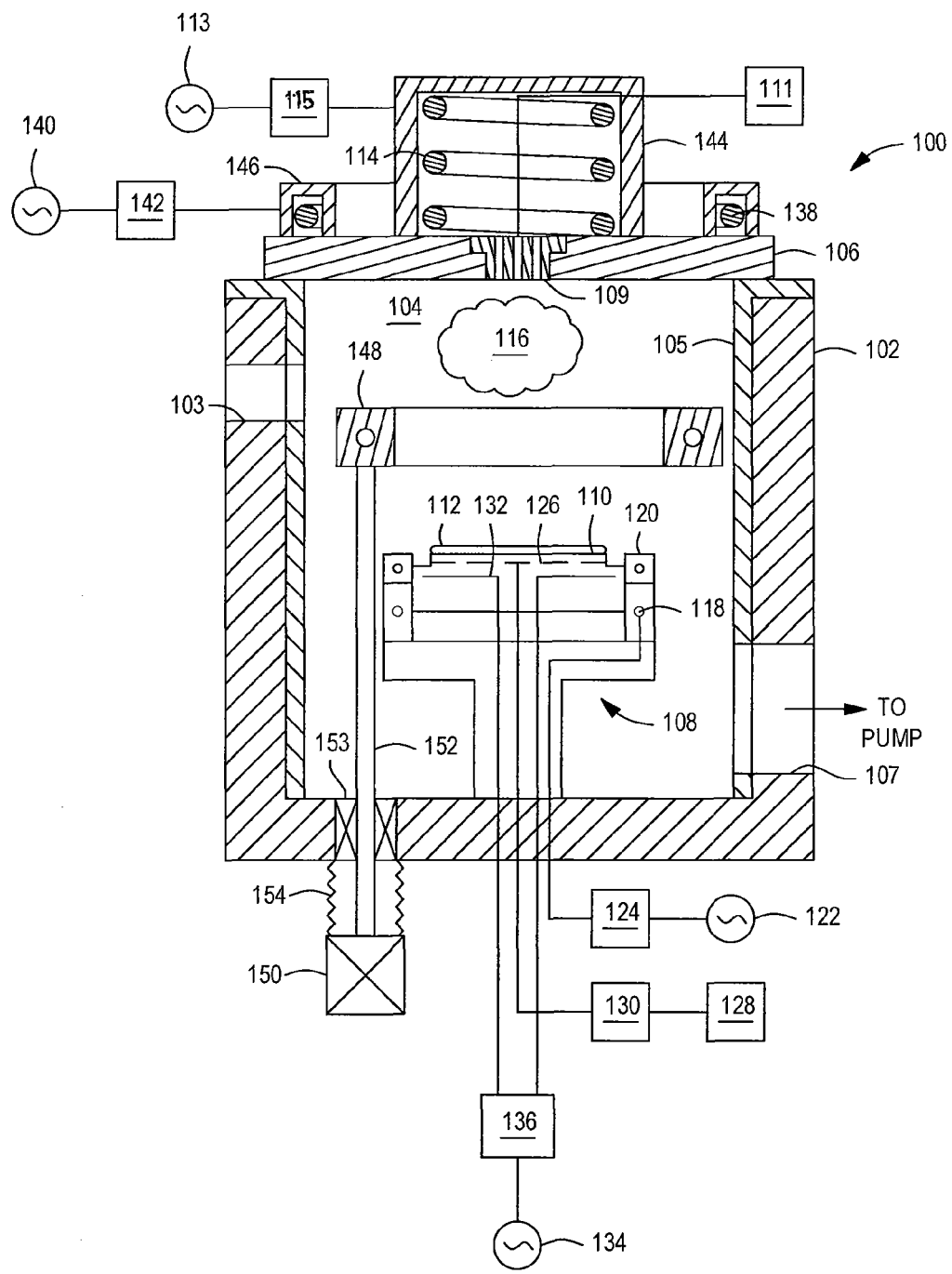
FIG. 1 depicts a schematic cross-sectional view of a process chamber in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of the present disclosure generally relate to tuning plasma proximate an edge of a substrate being processed to improve uniformity. The following process chamber description is provided for context and exemplary purposes, and should not be interpreted or construed as limiting the scope of the disclosure.

FIG. 1 depicts a schematic cross-sectional side view of an apparatus for processing a substrate including a process chamber 100 in accordance with some embodiments of the present disclosure. The process chamber 100 may be utilized alone or, as a processing module of an integrated semiconductor substrate processing system, or cluster tool, such as a CENTURA® integrated semiconductor wafer processing system, available from Applied Materials, Inc. of Santa Clara, Calif. Examples of suitable plasma reactors that may advantageously benefit from modification in accordance with embodiments of the present disclosure include inductively coupled plasma etch reactors such as the DPS® line of semiconductor equipment or other inductively coupled plasma reactors, such as MESA™ or the like also available from Applied Materials, Inc. The above listing of semiconductor equipment is illustrative only, and other etch reactors, and non-etch equipment (such as CVD reactors, or other semiconductor processing equipment) may also be suitably modified in accordance with the present teachings.

The process chamber 100 includes a chamber body 102 having an internal processing volume 104, a dielectric lid 106 disposed above the internal processing volume 104, a substrate support 108 having a support surface 110 to support a substrate 112, an inductive coil 114 disposed above the dielectric lid 106 to inductively couple RF energy into the internal processing volume 104 to form a plasma 116 above the substrate support 108. The inventors have observed that the electromagnetic field and plasma density and chemistry change violently near the edge of the substrate 112 due to the existence of multiple material interfaces and geometric shapes/edges. As such, the inventors have provided a method and apparatus for processing a substrate in which the plasma near the substrate may be fine-tuned.

The process chamber 100 further includes an opening 103 (i.e., a slit valve) through which a robotic arm (not shown) extends to supply/remove a substrate to/from the process chamber 100. The process chamber 100 further includes a chamber liner 105 disposed on an inside wall of the chamber body 102 to protect the chamber walls from deposition of process materials, which can damage the process chamber 100 and/or flake off and damage subsequently processed substrates. The process chamber further includes a pump opening 107 to which a pump (not shown) is coupled to pump out process gases from the internal processing volume 104. The dielectric lid 106 includes a showerhead 109 coupled to a gas source 111 to supply one or more gases to the internal processing volume 104. The inductive coil 114 is coupled to a first RF power source 113 through a first match network 115 to form the plasma 116.

In some embodiments, the process chamber 100 includes a first inductive exciter coil 118 disposed in the substrate support 108 and a first inductive applicator ring 120 spaced apart from and disposed above the first inductive exciter coil 118 to couple RF energy from the first inductive exciter coil 118 to the plasma 116 proximate an edge of the substrate 112. The first inductive applicator ring 120 couples to the first inductive exciter coil 118 in a similar manner as the primary and secondary windings of a transformer. In some embodiments, the first inductive exciter coil 118 is a single winding coil formed of a conductive material. The first inductive exciter coil 118 is coupled to a second RF power source 122 through a second match network 124. However, the first inductive exciter coil 118 may include any number of windings suitable for achieving plasma fine tuning. In some embodiments, the first inductive exciter coil 118 and the first inductive applicator ring 120 may each have a diameter greater than a diameter of the substrate 112. In some embodiments, diameters of the first inductive exciter coil 118 and the first inductive applicator ring 120 are substantially the same. The first inductive exciter coil 118 is positioned proximate an edge of the substrate 112 to facilitate fine tuning of the plasma in the proximate the edge of the substrate 112 to address the problems discussed above.

Figure 2:
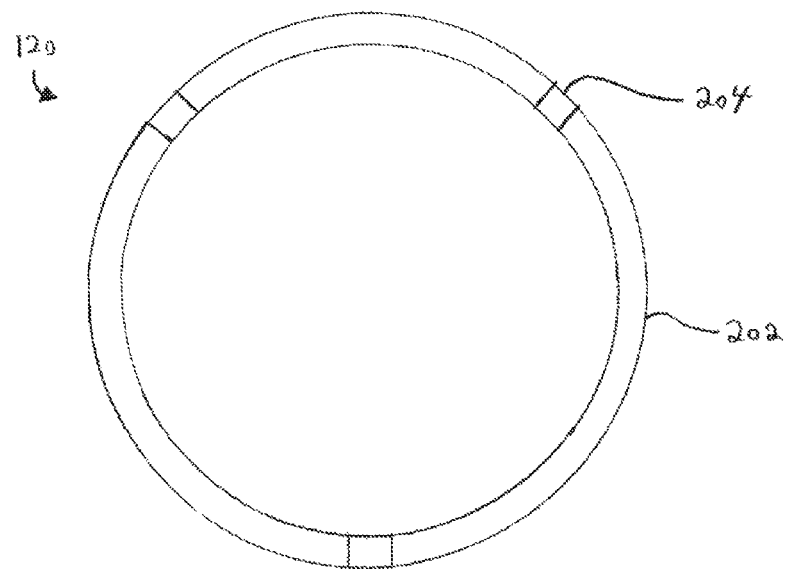
FIG. 2 depicts a schematic top view of an applicator ring in accordance with some embodiments of the present disclosure.

The first inductive applicator ring 120 comprises a plurality of metallic segments coupled to each other via a corresponding plurality of capacitors. For example, as shown in FIG. 2, in some embodiments, the first inductive applicator ring 120 may include three metallic segments 202 coupled to each other via three capacitors 204. However, any number of metallic segments 202 and capacitors 204 may be used to tune the impedance of the first inductive applicator ring 120 to function properly at the frequency of the second RF power source 122. Although fewer capacitors 204 may be used, the inventors have observed that the capacitors 204 may be beneficially distributed axisymetrically about the first inductive applicator ring 120 to prevent any unwanted skews in the plasma. Furthermore, the values of the capacitors may be selected to advantageously avoid a large voltage drop across the capacitors.

In some embodiments, the substrate support 108 includes a mesh 126 (i.e., an electrostatic chucking electrode) to chuck the substrate 112 to the support surface 110. The mesh 126 is coupled to a DC power source 128 through a filter 130 which prevents reflected RF power from reaching and damaging the DC power source 128. In some embodiments, the substrate support 108 includes a bias electrode 132 to provide a bias to the substrate 112. The bias electrode 132 is coupled to a third RF power source 134 through a third matching network 136. In such an embodiment, the first inductive applicator ring 120 should have an impedance value sufficient to reflect power from the bias electrode 132. The inventors have discovered that in order to prevent interference between the first inductive exciter coil 118 and the bias electrode 132, the second RF power source 122 may be operated at a first frequency and the third RF power source 134 may be operated at second frequency different than the first frequency. In some embodiments, the second RF power source 122 and the third RF power source 134 may alternatively operate at the same frequency but out of phase. In such an embodiment, voltage-current sensors (not shown) are installed between the second and third RF power sources 122, 134 and the first inductive exciter coil 118 and bias electrode 132, respectively to sense the RF phase in each line and send the detected RF phase value to a controller (not shown).

In some embodiments, the process chamber 100 may include a second inductive exciter coil 138 disposed above the dielectric lid 106 concentrically around the inductive coil 114. The second inductive exciter coil 138 is configured similarly to the first inductive exciter coil 118. In some embodiments, the second inductive exciter coil 138 has a diameter that is larger than the diameter of the first inductive exciter coil 118. The second inductive exciter coil 138 is coupled to a fourth RF power source 140 through a fourth matching network 142. In such an embodiment, the inductive coil 114 may be disposed within a first housing 144 and the second inductive exciter coil 138 may be disposed within a second housing 146 to prevent interference between the inductive coil 114 and the second inductive exciter coil 138. To further prevent interference between the inductive coil 114 and the second inductive exciter coil 138, the first RF power source 113 may operate at a third frequency and the fourth RF power source may operate at a fourth frequency different than the third frequency. Alternatively, the first and fourth RF power sources 113, 140 may operate at the same frequency but out of phase, as described above with respect to the second and third RF power sources 122, 134. In some embodiments, the second inductive exciter coil 138 has a diameter larger than the diameter of the substrate 112.

In some embodiments, the process chamber 100 may include a second inductive applicator ring 148 coupled to a lift mechanism 150 to couple RF energy from at least one of the first inductive exciter coil 118 and the second inductive exciter coil 138 to the plasma 116. The second inductive applicator ring 148 is substantially the same as the first inductive applicator ring 120 depicted in FIG. 2 and includes a plurality of metallic segments coupled together via a corresponding plurality of capacitors. In some embodiments, diameters of the second inductive applicator ring 148 and the second inductive exciter coil 138 are substantially the same. In some embodiments, diameters of the second inductive applicator ring 148 and the first inductive exciter coil 118 are substantially the same. In some embodiments, diameters of the second inductive applicator ring 148, the first inductive exciter coil 118, and the second inductive exciter coil 138 are substantially the same.

The second inductive applicator ring 148 may be coupled to the lift mechanism 150 via a shaft 152 which extends through bearings 153 disposed in a floor of the process chamber 100. To ensure proper sealing of opening through which the shaft 152 extends, bellows 154 is disposed between the lift mechanism 150 and the process chamber 100. The lift mechanism 150 may be any suitable mechanism for controlling the position of the second inductive applicator ring 148 such as a motor, actuator, or the like.

Figure 3:
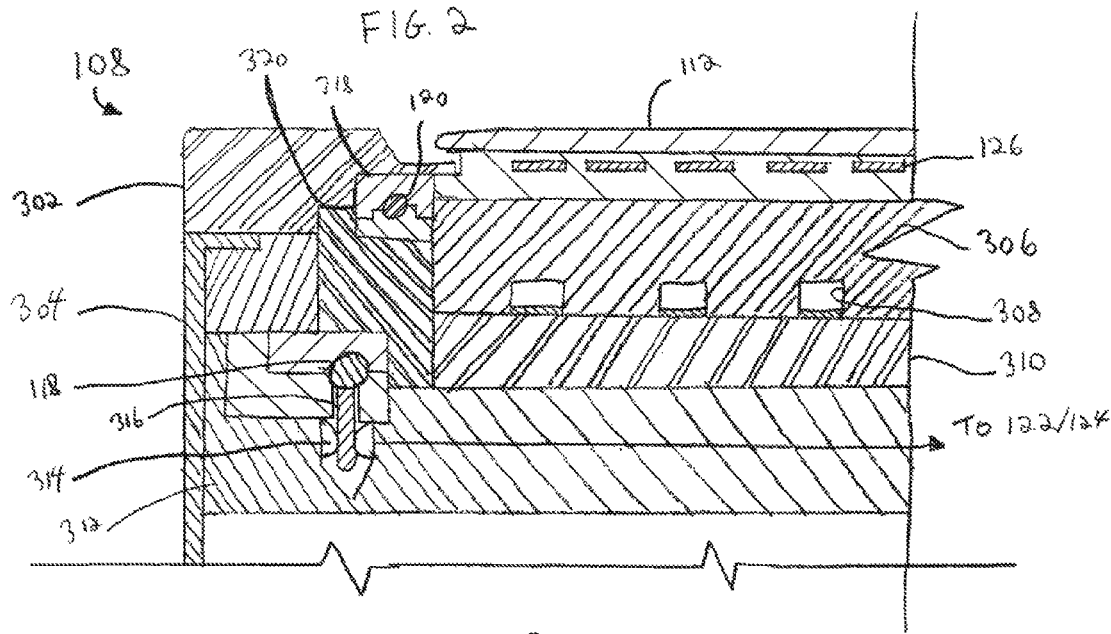
FIG. 3 depicts a partial cross-sectional view of a substrate support in accordance with some embodiments of the present disclosure.

FIG. 3 depicts a partial cross-sectional view of the substrate support 108 in accordance with some embodiments of the present disclosure. In FIG. 3 some elements have not been cross-hatched so as not to obscure details. In some embodiments, the substrate support 108 includes a process ring 302 disposed about the substrate 112, a liner 304 disposed around the periphery of the substrate support 108, a heat transfer layer 306 having a plurality of heat transfer channels 308, and an insulation layer 310 disposed beneath the heat transfer layer 306. A base layer 312 is provided with an input terminal 314 which is coupled to the second RF power source 122 and the second match network 124. A leg 316 (e.g., a banana plug) of the first inductive exciter coil 118 extends into the input terminal 314 to receive RF power from the second RF power source 122.

In some embodiments, the first inductive applicator ring 120 is encapsulated in an annular insulator 318. For example, the first inductive applicator ring 120 may be sandwiched between two halves of the annular insulator 318. In some embodiments, the annular insulator 318 may be formed of a process compatible dielectric such as, for example, quartz, aluminum oxide, silicon oxide, and yttrium oxide. The inventors have observed that in some cases some plasma may couple to the first inductive exciter coil 118. To prevent the plasma from coupling to the first inductive exciter coil 118, the substrate support 108 may include an insulator ring 320 disposed between the first inductive exciter coil 118 and the first inductive applicator ring 120 to space the first inductive exciter coil 118 apart from the first inductive applicator ring 120. Different sized insulator rings 320 may be used to control the spacing between the first inductive exciter coil 118 and the first inductive applicator ring 120.

In some embodiments, gaps may exist between components of the substrate support 108 and, as such, the components may not be in robust thermal contact with one another. Accordingly, in some embodiments, the substrate support 108 may include thermal pads (not shown) at the interfaces between components of the substrate support 108 to facilitate heat transfer (e.g., cooling) of components of the substrate support 108. For example, a thermal pad may be disposed between the first inductive applicator ring 120 and the heat transfer layer 306 to cool the first inductive applicator ring 120. Similar thermal pads may be disposed between the first inductive exciter coil 118 and the base layer 312.

Figure 4:
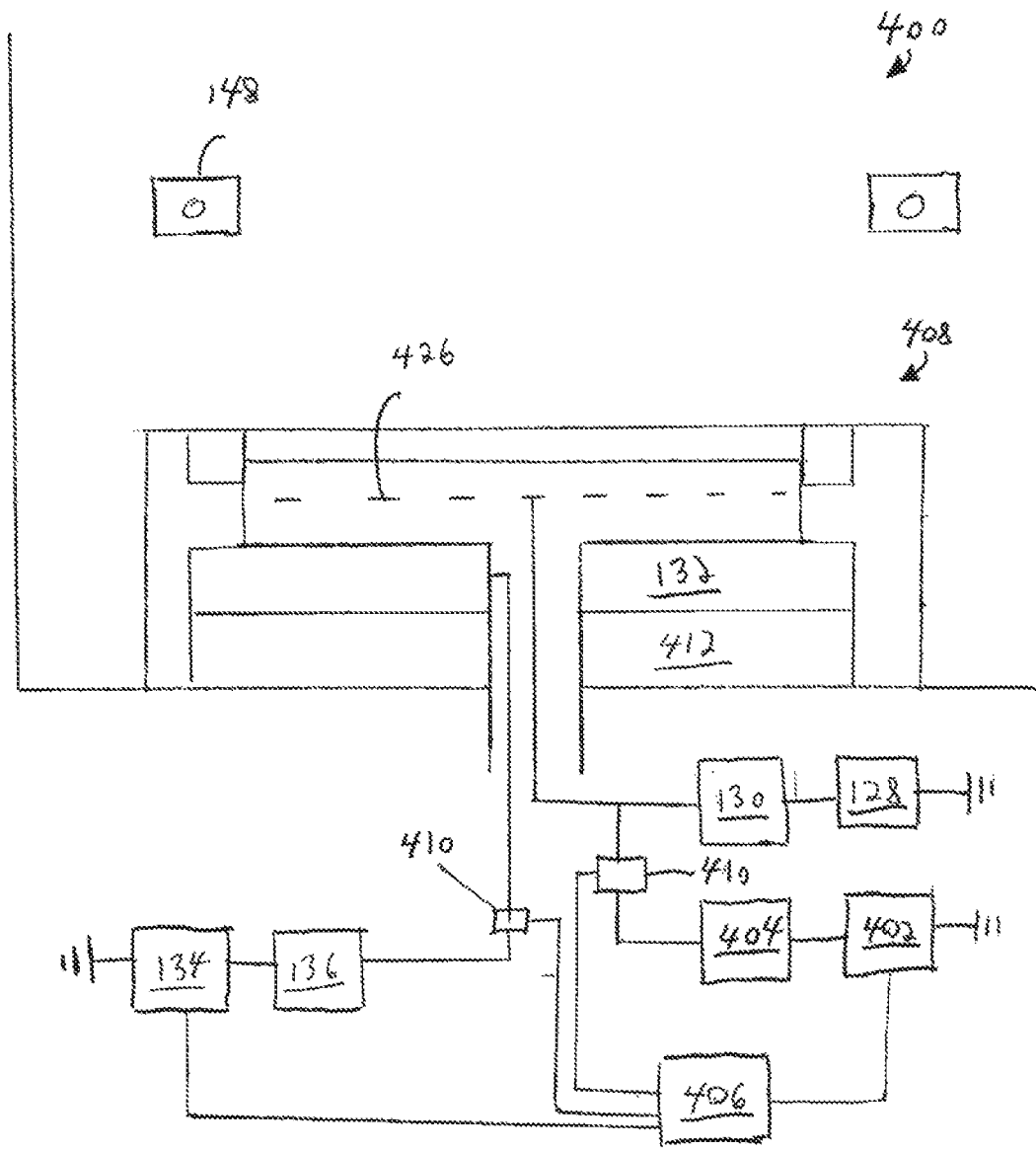
FIG. 4 depicts a schematic view of a process chamber in accordance with embodiments of the present disclosure.

FIG. 4 depicts a schematic view of a processing chamber 400 in accordance with some embodiments of the present disclosure. The processing chamber 400 is substantially similar to the processing chamber 100 illustrated in FIG. 1. As such, a description of similar elements is omitted here for the sake of conciseness. In some embodiments, the processing chamber 400 includes a substrate support 408 having a mesh 426 similar to the mesh 126. However, the mesh 426 is coupled to a fifth RF power source 402 through a fifth matching network 404 in addition to the DC power source 128 and filter 130. As such, the mesh 426 may act as an inductive exciter electrode. The functionality of the mesh 426 may be switched between providing a chucking force to the substrate 112, as described above, and providing RF power to the plasma using a controller 406. In addition, the controller 406 is coupled to a plurality of voltage-current sensors 410 to control the phase of the RF generators so that the RF generators are out of phase.

Figure 5:
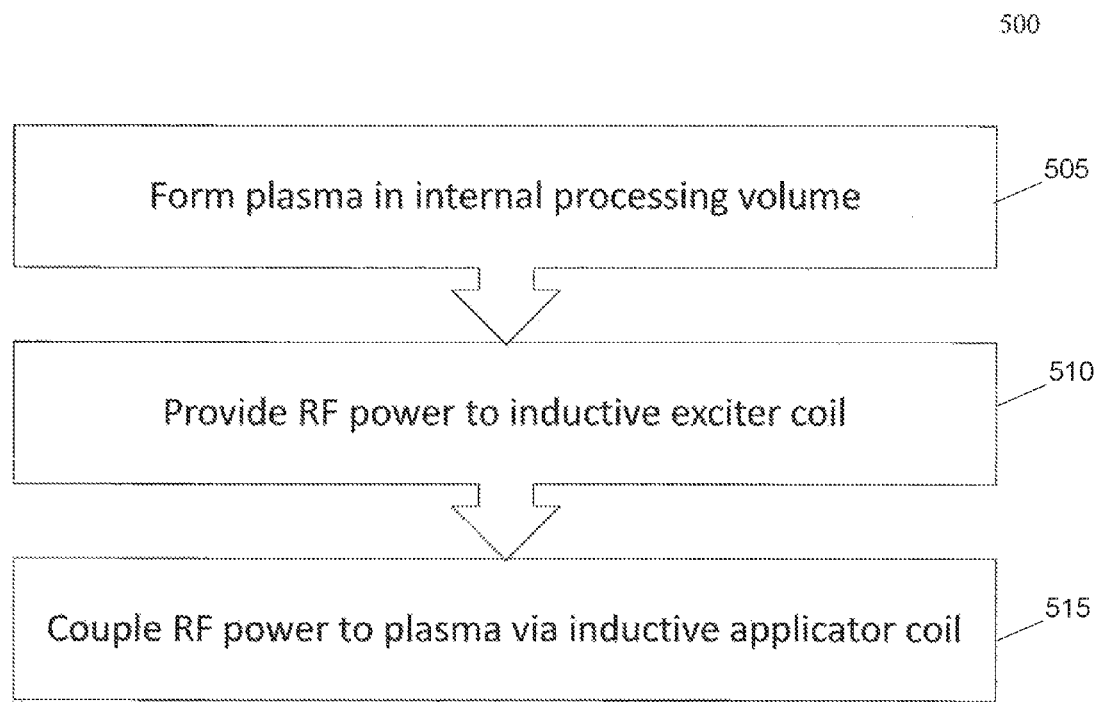
FIG. 5 depicts a flowchart illustrating a method of processing a substrate in accordance to some embodiments of the present disclosure.

FIG. 5 is a flowchart depicting a method 500 of processing a substrate in accordance with some embodiments of the present disclosure. At 505 a plasma is formed in an internal processing volume of a process chamber above a substrate disposed on a substrate support. At 510, RF power is provided to an inductive exciter coil disposed in the substrate support. At 515, the RF power is coupled to the plasma to tune the plasma proximate an edge of the substrate using an inductive applicator coil disposed about the substrate.

While the foregoing is directed to some embodiments of the present disclosure, other and further embodiments may be devised without departing from the basic scope thereof.

What is claimed is:

1. An apparatus for processing a substrate, comprising:
a process chamber having an internal processing volume disposed beneath a dielectric lid of the process chamber;
a substrate support disposed in the process chamber and having a support surface to support a substrate;
an inductive coil disposed above the dielectric lid to inductively couple RF energy into the internal processing volume to form a plasma above the substrate support; and
a first inductive applicator ring, having no physical connection to an RF power source, coupled to a lift mechanism to position the first inductive applicator ring within the internal processing volume to couple RF energy from at least one inductive exciter coil to the plasma.

2. The apparatus of claim 1, further comprising:
a first inductive exciter coil of the at least one inductive exciter coil, the first inductive exciter coil disposed in the substrate support to couple RF energy to the first inductive applicator ring.

3. The apparatus of claim 2, further comprising:
a second inductive exciter coil of the at least one inductive exciter coil, the second inductive exciter coil disposed above the dielectric lid concentrically around the inductive coil to couple RF energy to the first inductive applicator ring.

4. The apparatus of claim 3, further comprising:
a second inductive applicator ring disposed in the substrate support to couple RF energy from the first inductive exciter coil to the plasma.

5. The apparatus of claim 4, wherein the first inductive applicator ring and the second inductive applicator ring comprise a plurality of metallic segments coupled together via a corresponding plurality of capacitors.

6. The apparatus of claim 5, wherein the inductive coil is coupled to a first RF power source through a first RF matching network, wherein the first inductive exciter coil is coupled to a second RF power source through a second RF matching network, and wherein the substrate support comprises a bias electrode coupled to a third RF power source through a third RF matching network.

7. The apparatus of claim 6, wherein the second RF power source is configured to operate at a first frequency and the third RF power source is configured to operate at a second frequency different than the first frequency.

8. The apparatus of claim 6, wherein the second RF power source and the third RF power source are configured to operate at the same frequency and out of phase.

9. The apparatus of claim 6, further comprising:
a mesh configured as a chucking electrode to chuck the substrate to the support surface and as an inductive exciter electrode to couple RF energy to the first inductive applicator ring, wherein the mesh is coupled to a fifth RF power source through a fourth matching network.

10. The apparatus of claim 9, further comprising:
a controller configured to selectively supply RF power from the fifth RF power source or DC power from a DC power source to the mesh to change a functionality of the mesh between providing a chucking force to the substrate and providing RF power to the plasma.

11. The apparatus of claim 4, wherein the second inductive applicator ring is encapsulated in an insulator.

12. The apparatus of claim 4, further comprising:
an insulator ring disposed between the first inductive exciter coil and the second inductive applicator ring to space the first inductive exciter coil apart from the second inductive applicator ring.

13. An apparatus for processing a substrate, comprising:
a process chamber having an internal processing volume disposed beneath a dielectric lid of the process chamber;
a substrate support disposed in the process chamber and having a support surface to support a substrate;
an inductive coil disposed above the dielectric lid to inductively couple RF energy into the internal processing volume to form a plasma above the substrate support;
a first inductive exciter coil disposed above the dielectric lid concentrically around the inductive coil; and
an inductive applicator ring coupled to a lift mechanism to position the inductive applicator ring within the internal processing volume, wherein the inductive applicator ring has no physical connection to an RF power source and is configured to couple RF energy from the first inductive exciter coil to the plasma.

14. The apparatus of claim 13, wherein the inductive applicator ring comprises a plurality of metallic segments coupled together via a corresponding plurality of capacitors.

15. The apparatus of claim 14, wherein the plurality of capacitors are spaced axisymmetrically about the inductive applicator ring.

16. The apparatus of claim 13, further comprising:
a second inductive exciter coil disposed in the substrate support, wherein the inductive applicator ring is configured to couple RF energy from the second inductive exciter coil to the plasma proximate an edge of the substrate.

17. The apparatus of claim 16, wherein the substrate support comprises a bias electrode coupled to a first RF power source through a first RF matching network, wherein the inductive coil is coupled to a second RF power source, wherein the first inductive exciter coil is coupled to a third RF power source through a second RF matching network, and wherein the second inductive exciter coil is coupled to a fourth RF power source through a third RF matching network.

18. The apparatus of claim 17, wherein at least one of:
the first RF power source operates at a first frequency and the fourth RF power source operates at a second frequency different than the first frequency, or
wherein the first RF power source and the fourth RF power source operate at the same frequency and out of phase, and
wherein at least one of:
the second RF power source operates at a third frequency and the third RF power source operates at a fourth frequency different than the third frequency, or
the second RF power source and third RF power source operate at the same frequency and out of phase.

19. The apparatus of claim 16, further comprising:
a thermal pad disposed between the second inductive exciter coil and a base layer of the substrate support.

* * * * *